United States Patent [19]
Seo et al.

[11] Patent Number: 5,677,886
[45] Date of Patent: Oct. 14, 1997

[54] SENSE AMPLIFIER CIRCUIT IN SEMICONDUCTOR MEMORY DEVICE

[75] Inventors: Dong-Il Seo, Suwon; Sei-Seung Yoon; Se-Jin Jeong, both of Seoul, all of Rep. of Korea

[73] Assignee: Samsung Electronics Co., Ltd., Suwon, Rep. of Korea

[21] Appl. No.: 558,105

[22] Filed: Nov. 13, 1995

[30] Foreign Application Priority Data

Nov. 12, 1994 [KR] Rep. of Korea ................. 1994-29690

[51] Int. Cl.$^6$ ................................................ G11C 13/00
[52] U.S. Cl. ................................................ 365/203; 365/233
[58] Field of Search ............................. 365/203, 189.01, 365/189.03, 233

[56] References Cited

U.S. PATENT DOCUMENTS 4,056,811  11/1977  Baker ................. 365/189.01

*Primary Examiner*—Terrell W. Fears
*Attorney, Agent, or Firm*—Cushman Darby & Cushman, IP Group of Pillsbury Madison & Sutro LLP

[57] ABSTRACT

There is provided in the present invention a signal generator which generates a bit line equalization signal and a signal generator which generates a sense amplifier equalization signal to control the bit line equalization circuit and the sense amplifier equalization circuit, respectively. The generated bit line equalization signal and sense amplifier equalization signal both have a voltage level that is at least about equal to, and preferably greater than, an external power supply voltage. The signals generated by these signal generators can thus be used by operating voltages which are much less than was previously possible.

21 Claims, 3 Drawing Sheets

SENSE AMPLIFIER CIRCUIT IN SEMICONDUCTOR MEMORY DEVICE

BACKGROUND OF THE INVENTION

The present invention relates to a semiconductor memory device, and more particularly to a sense amplifier circuit for amplifying input/output data to a predetermined level.

A semiconductor memory device such as a DRAM (Dynamic Random Access Memory) has a sense amplifier circuit for sensing data that is read from a memory cell and amplifying the data to a predetermined level. A DRAM memory cell typically includes one access transistor and one capacitor. Data is read from memory cells in a DRAM as follows. A word line coupled to a gate terminal of the access transistor is used to select that associated memory cell, the data (charge) stored in the associated capacitor is transferred to a bit line through the access transistor. The data read from the memory cell is transferred through the bit line and is then amplified by the sense amplifier circuit connected to the bit line. Thereafter, the amplified data is transferred to an input/output line and output from the chip. Data can also be written to the memory cells of the DRAM. In a write operation, data is input through the input/output line amplified by the sense amplifier circuit and is then written into the appropriate memory cell by activating the memory cell access transistor associated with that memory cell to allow the data (charge) to flow into the associated capacitor and be stored in that capacitor.

FIG. 1 is a view illustrating a conventional sense amplifier circuit of a semiconductor memory device. There are provided in the sense amplifier circuit bit lines BL and fheightBL, a bit line equalization circuit 34, a sense amplifier 36, a column select gate 38, a sense amplifier equalization circuit 40, and a sense amplifier activating circuit 42. The bit lines BL and fheightBL to which data is transferred are connected to the memory cell MC. The bit line equalization circuit 34 inputs a precharge voltage VBL and equalizes the bit lines BL and fheightBL to the same voltage level prior to a sensing operation. The sense amplifier 36 differentially amplifies the data transferred from a memory cell MC to the bit lines BL and fheightBL M. The column select gate 38 is connected to the column select line CSL to thereby connect the bit lines BL and fheightBL to the input/output lines IO and fheightIO. The sense amplifier equalization circuit 40 equalizes the sense amplifier nodes to the precharge voltage VBL. Once equalized, P-type sense amplifier and N-type sense amplifier latch enable signals LA and fheightLA for controlling the sense amplifier 36 are generated as a result of the sense amplifier activating circuit 42, which is connected to the control signal equalization circuit 40 and receives signals LAPG and LANG.

Each memory cell MC has an access transistor 2 coupled to a word line and a bit line, and a capacitor 4 coupled between the access transistor 2 and a substrate voltage VP. The bit line equalization circuit 34 has NMOS transistors 6, 8, and 10 connected between the bit lines BL and fheightBL and having gate terminals which receive a bit line equalization signal PEQ. Further, the precharge voltage VBL is input to the source terminals of the NMOS transistors 6 and 8. The sense amplifier 36 is comprised of a P-type sense amplifier and an N-type sense amplifier. The P-type sense amplifier has PMOS transistors 12 and 14 which are connected in series between the bit lines BL and fheightBL. P-type sense amplifier latch enable signal LA is input to the connected source terminals of PMOS transistors 12 and 14, with the gate terminals of PMOS transistors 14 and 12 connected to the bit lines BL and fheightBL, respectively. N-type sense amplifier has NMOS transistors 16 and 18 connected in series to the bit lines BL and fheightBL. N-type sense amplifier latch enable signal fheightLA is input to the connected source terminals of NMOS transistor 16 and 18, with the gate terminals connected to the bit lines fheightBL and BL, respectively. The column select gate 38 has NMOS transistors 20 and 22 whose gate terminals are coupled to the column select line CSL and which connect the bit lines BL and fheightBL to the input/output lines IO and fheightIO under control of the column select line CSL. The sense amplifier equalization circuit 40 has NMOS transistors 24, 26, and 28 whose gate terminals are each connected to the sense amplifier equalization circuit PLAEQ, which is produced when the precharge voltage VBL is input to the source terminals of NMOS transistors 24 and 26. The sense amplifier activating circuit 42 has NMOS transistors 30 and 32 whose gate terminals are connected to the P-type sense amplifier activating signal LAPG and the N-type sense amplifier activating signal LANG, respectively. Drain terminals of transistors 30 and 32 are respectively connected to one terminal of the NMOS transistors 24 and 26, and each respectively connected to one terminal of transistor 28. Source terminals of transistors 30 and 32 are each connected to the ground voltage VSS.

FIG. 2 is a timing diagram of the circuit illustrated in FIG. 1. First, if a row address strobe signal fheightRAS is changed to the "low" level from the "high" level, the word line connected to the gate terminal of the memory cell MC is enabled. If at that time cell data is at a "1" level, due to the threshold voltage of the access transistor 2, the word line is boosted by about 1.5V above the level of the cell data. The bit line equalization signal PEQ is maintained at the "high" level while the row address strobe signal fheightRAS is at the "high" level, i.e., a stand-by state. While fheightRAS is at a "high" level, the NMOS transistors 6, 8, and 10 are turned on and the bit lines BL and fheightBL are thus equalized to a level of ½•IVC. When the latch enable equalization signal PLAEQ input to the sense amplifier equalization circuit 40 is maintained at the "high" level, the P-type sense amplifier and N-type sense amplifier latch enable signals LA and fheightLA are also equalized to the level of the ½•IVC. The bit line equalization signal PEQ is changed to the "low" level from the "high" level to cause disabling of the bit line equalization circuit 34 before the word line is enabled. Similarly, the latch enable equalization signal PLAEQ for equalizing the P-type sense amplifier and N-type sense amplifier latch enable signals LA and fheightLA, is also changed to the "low" level from the "high" level before the word line is enabled.

FIG. 3 is a view illustrating the bit line equalization signal PEQ generator used with the circuit illustrated in FIG. 1. The bit line equalization signal generator as shown in FIG. 3 has a PMOS transistor 44 and an NMOS transistor 46 which are connected in series to the internal voltage IVC and the ground voltage VSS. The gates of transistors 44 and 46 are commonly connected to a control signal PBLS. The bit line equalization signal PEQ is maintained at the level of the ground voltage VSS or the internal voltage IVC according to the logic level of the control signal PBLS.

FIG. 4 is a view illustrating the latch enable equalization signal PLAEQ generator used with the circuit illustrated in FIG. 1. The latch enable equalization signal generator has a PMOS transistor 48 and an NMOS transistor 50 which are connected in series to the internal voltage IVC and the ground voltage VSS. The gates of the transistors 48 and 50 are commonly connected to the control signal PBLS. The latch enable equalization signal PLAEQ is maintained at the level of the ground voltage VSS or the internal voltage IVC according to the logic level of the control signal PBLS. The control signal PBLS is used by the generator of FIGS. 3 and 4 and determines whether a corresponding sense amplifier is enabled.

Referring to FIG. 2, when cell data is at a "1" level for the memory cell MC illustrated in FIG. 1 and the word line WL is enabled, the voltage level of the bit line BL is raised by Δ VBL due to charge sharing between the bit line BL and the cell capacitor. After the charge sharing is completed, if the N-type sense amplifier activating signal LANG is changed to the "high" level from the "low" level, the voltage level of the N-type sense amplifier latch enable signal $\overline{LA}$ is lower than the level of the ½•IVC and the NMOS transistors 16 and 18 are turned on to perform a sensing operation. Since the voltage level of the bit line BL is higher than that of the bit line $\overline{BL}$ by Δ VBL, the transistor 18 is thus turned on much more than transistor 16, which causes the bit line $\overline{BL}$ to fall to a lower voltage level while the level of bit line of BL remains at its level of ½ IVC+Δ VBL.

While the voltage level of the bit line $\overline{BL}$ falls, the P-type sense amplifier activating signal LAPG is changed to the "low" level from the "high" level and the PMOS transistor 30 is thus turned on, so that the PMOS transistors 12 and 14 are turned on. At this time, since the PMOS transistor 12 is more easily turned on than the PMOS transistor 14, the difference between the voltages of the bit lines BL and $\overline{BL}$ increases. During a read operation, once the difference of the voltages between the bit lines BL and $\overline{BL}$ is more than a certain level, the column select line CSL is enabled to the "high" level and the NMOS transistors 20 and 22 are turned on. The bit lines are thus connected to the input/output lines I/O and $\overline{IO}$ and the data of the bit line is transferred to the input/output line.

As well known in the above described operation, if the bit line equalization signal PEQ is changed to the "high" level from the "low" level to equalize the bit lines BL and $\overline{BL}$, the bit lines BL and $\overline{BL}$ having the internal voltage IVC and the ground voltage VSS are equalized by the NMOS transistors 6, 8 and 10 to the precharge voltage VBL (typically ½•IVC). The internal voltage IVC is used rather than the external power supply voltage VCC to reduce operable current and the noise. Similarly, when the latch enable equalization signal PLAEQ is changed to the "high" level from the "low" level, the NMOS transistors 24, 26, and 28 are operated and the source terminals of transistors 12, 14, 16, and 18 are also equalized to the precharge voltage VBL. In a semiconductor memory device using an external power supply voltage VCC of 5V or 3.3V, the internal voltage IVC is generally about 2.8V-3V and the level of the precharge voltage is about 1.4V-1.5V. With voltages at these levels, there is typically no problem with the equalization operation.

However, if the level of the internal voltage IVC is lowered due to lowering of the external power supply voltage (i.e., about 2V), the internal voltage IVC becomes about 1V. If these voltage levels are used, problems arise if the equalization circuits previously described are used. With these voltages, the NMOS transistor 10 of the bit line equalization circuit 34 comes to have a threshold voltage that is more than 1V due to the body effect. Therefore, as the bit line $\overline{BL}$ arrives at the precharge level voltage VBL from the ground voltage VSS, a drain-source voltage Vds becomes small and the NMOS transistor 10 is almost turned off, so that it is difficult to smoothly perform a charge sharing operation. Further, a gate-source voltage Vgs of almost 1V of the NMOS transistor 6 will occur, which prevents NMOS transistor 6 from assisting with the equalization of the bit line BL. The NMOS transistor 8 and the sense amplifier equalization circuit 40 suffer the same problems and cannot perform well the desired equalization. Further, if the equalization time of the bit lines BL and $\overline{BL}$ and the equalization time of the P-type sense amplifier and N-type amplifier latch enable signals LA and $\overline{LA}$ are delayed in order to compensate for the inefficiency of the equalization of these voltage levels, the precharge time of the row address strobe signal $\overline{RAS}$ becomes too long.

In order to solve this problem, the conventional art lowers the threshold voltages of the NMOS transistors 6, 8, and 10 of the bit line equalization circuit 34 and the NMOS transistors 24, 26, and 28 of the sense amplifier equalization circuit 40. However, this necessitates an additional and undesired mask process which increases the time and cost required to manufacture the wafer containing these memory chips.

SUMMARY OF THE INVENTION

It is therefore object of the invention to provide a bit line sense amplifier capable of smoothly performing an equalization operation using a bit line equalization circuit and sense amplifier equalization circuit that are activated, respectively, using a bit line equalization signal and a sense amplifier equalization signal whose voltage levels are at least greater than an external power supply voltage.

In order to achieve these objects, there is provided in the present invention a signal generator which generates a bit line equalization signal and a signal generator which generates a sense amplifier equalization signal to control the bit line equalization circuit and the sense amplifier equalization circuit, respectively. The generated bit line equalization signal and sense amplifier equalization signal both have a voltage level that is at least about equal to, and preferably greater than, an external power supply voltage. The signals generated by these signal generators can thus be used by operating voltages which are much less than was previously possible.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 5:
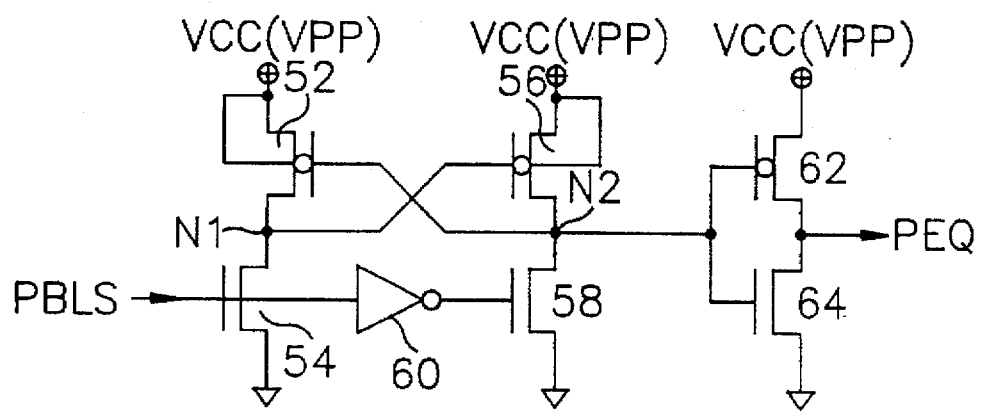
FIG. 5 is a view illustrating a bit line equalization signal generator according to the present invention.

FIG. 5 is a view illustrating a bit line equalization signal generator according to the present invention. There are provided in the bit line equalization signal generator PMOS transistors 52, 56, and 62 and NMOS transistors 54, 58, and 64. The PMOS transistor 52 is connected between the external power supply voltage VCC and a control node N1. The NMOS transistor 54 is connected between the control node N1 and ground voltage VSS and has a gate terminal to which a control signal PBLS is input. The PMOS transistor 56 is connected between the external power supply voltage VCC and an output node N2. The NMOS transistor 58 is connected between the output node N2 and the ground voltage VSS and has a gate terminal which receives an output signal of inverter 60. Inverter 60 inputs the control signal PBLS and uses the internal voltage IVC as an operating voltage. The PMOS transistor 62 and the NMOS transistor 64 whose gate terminals are connected to the output node N2 are coupled in series between the external power supply voltage VCC and the ground voltage VSS. In addition, the gate terminal of the PMOS transistor 52 is coupled to output node N2 and terminal terminal of the PMOS transistor 56 is coupled to control node N1. As shown, the cross coupled PMOS transistors 52 and 56 and the NMOS transistors 54 and 58 form a differential circuit, generally called a cascade voltage convertor.

Even though the bit line equalization signal generator shown in FIG. 5 uses the higher external power supply voltage VCC rather than the internal voltage IVC as the operating voltage, it is possible to use a boost voltage VPP instead of the external power voltage VCC, the boost voltage being greater than the external power supply voltage by a predetermined level. The boost voltage VPP is preferably used when the external power supply voltage VCC becomes lower than about 2.3V. For example, if the external power supply voltage VCC is 2V, the voltage level of the word line coupled to the gate terminal of the access transistor of the DRAM cell should be about 2V+1.5V=3.5V. Therefore, a boost circuit which provides a boost voltage VPP as is known in the art, can be advantageously implemented with the present invention. One such boost circuit is disclosed in U.S. Pat. No. 5,367,489, which is hereby expressly incorporated by reference.

With the bit line equalization signal generator illustrated, if the control signal PBLS is at a "high" level and the NMOS transistor 54 is turned on, the current flowing into the control node N1 is discharged and the potential of the control node N1 is at a "low" level. This turns on the PMOS transistor 56 connected to the control node N1. Thus, the output node N2 is charged to the external power supply voltage level VCC (or VPP). The PMOS transistor 62 is therefore turned off and the NMOS transistor 64 is turned on to generate the bit line equalization signal PEQ at a "low" level.

When the control signal PBLS is at a "low" level, the NMOS transistor 54 is turned off and the NMOS transistor 58 is turned on. The current flowing into the output node N2 is therefore discharged and the potential of the output node N2 is at a "low" level, which rams on the PMOS transistor 52 connected to the output node N2. Thereby, the control node N1 is charged to external power supply voltage level and the PMOS transistor 56 is turned off to thereby maintain the output node N2 at the "low" level. As a result, the PMOS transistor 62 is turned on and the NMOS transistor 64 is turned off to generate the bit line equalization signal PEQ at a "low" level.

Figure 1:
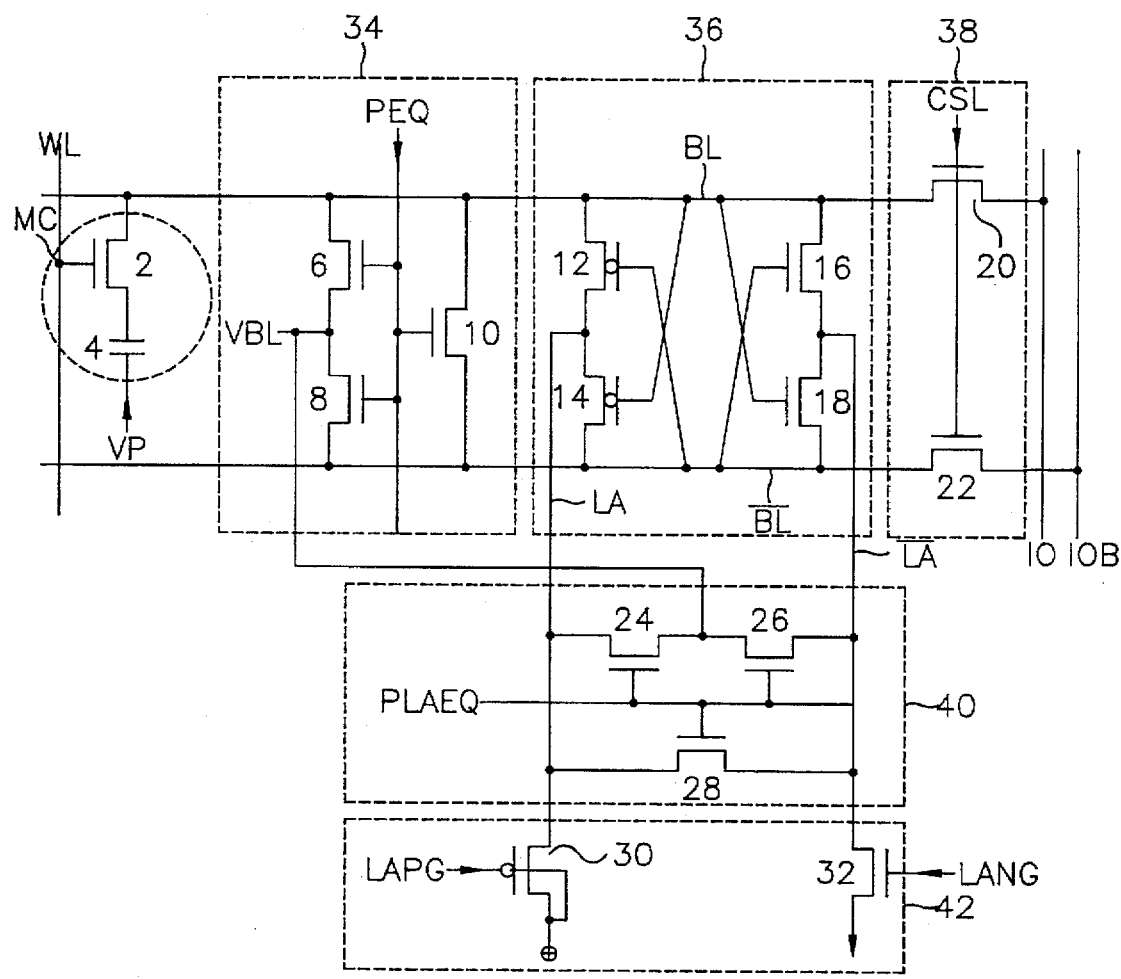
FIG. 1 is a view illustrating a sense amplifier circuit of a semiconductor memory device.
Figure 2:
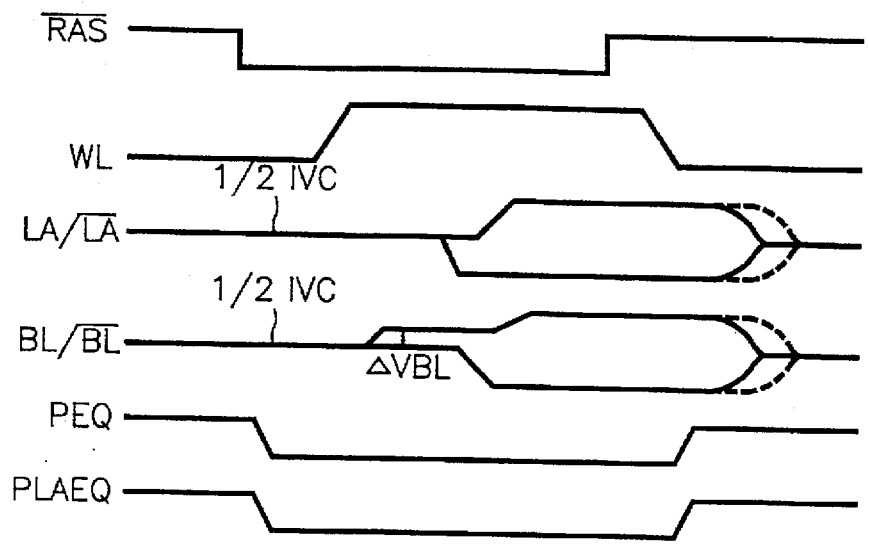
FIG. 2 is a timing diagram of the circuit of FIG. 1.
Figure 3:
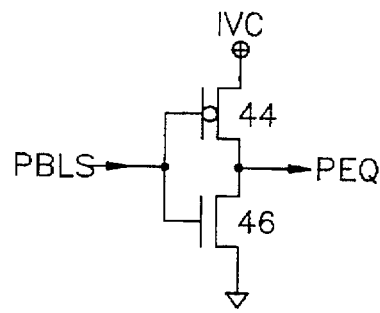
FIG. 3 is a view illustrating a conventional bit line equalization signal generator.
Figure 4:
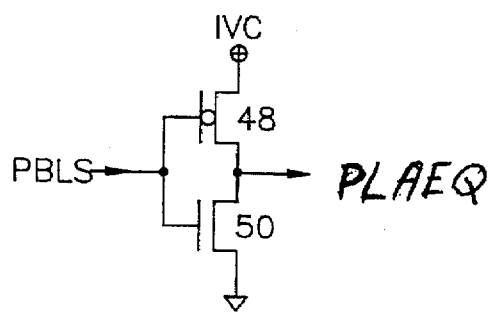
FIG. 4 is a view illustrating a conventional latch enable signal generator.

In such a circuit configuration, the control signal PBLS is used as block select information to determine whether a corresponding sense amplifier is enabled. The bit line equalization signal PEQ is maintained at the "low" level during the sensing operation of the bit line. Moreover, while the equalization operation is performed, the bit line equalization signal PEQ is maintained at the level of the external power supply voltage VCC of about 3.3V. When such a voltage is used, the NMOS transistors 6, 8, and 10 of the equalization circuit shown in FIG. 1 are turned on sufficiently during the equalization of the bit lines BL and fheightBL. When the bit lines BL and fheightBL arrive at the level of the ½•IVC, i.e, 1V, the gate-source voltages of the NMOS transistors 6, 8, and 10 become more than 2.3V. Therefore, even if the threshold voltages of the NMOS transistors 6, 8, and 10 are given as Vtn≧1V due to the body effect, it is possible to smoothly perform equalization of the bit line.

In addition, in the bit line equalization signal generator shown in FIG. 5, even if the boost voltage VPP is used as the operating voltage instead of the external power supply voltage VCC, the same efficient operation is provided as described above.

Figure 6:
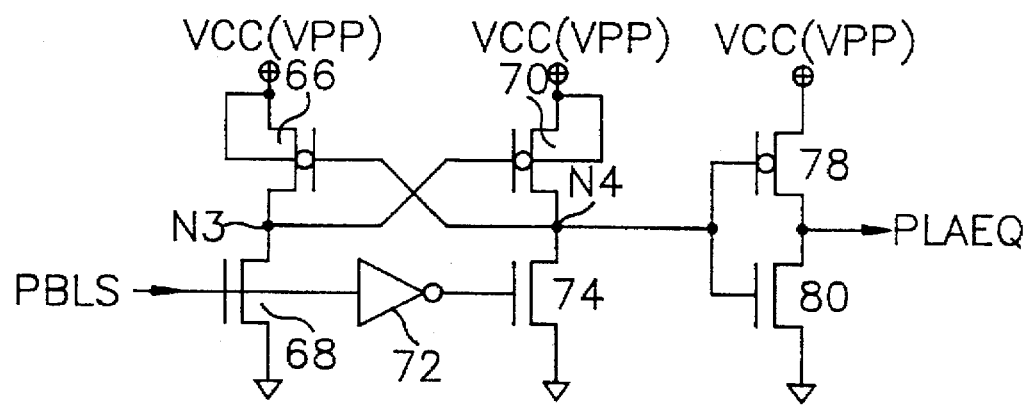
FIG. 6 is a view illustrating a latch enable signal generator according to the present invention.

FIG. 6 is a view illustrating a latch enable equalization signal generator according to the present invention. There are provided in the latch enable equalization signal generator of FIG. 6 PMOS transistors 66, 70, and 78 and NMOS transistors 68, 74, and 80. The PMOS transistor 66 is coupled between the external power supply voltage VCC and a control node N3. The NMOS transistor 68 is coupled between the control node N3 and the ground voltage VSS and has a gate terminal to which the control signal PBLS is input. The PMOS transistor 70 is coupled between the external power supply voltage VCC and an output node N4. The NMOS transistor 74 is coupled between the output node N4 and the ground voltage VSS and has a gate terminal which receives an output signal of an inverter 72. Inverter 72 inputs the control signal PBLS and used the internal voltage IVC as the operating voltage. The PMOS transistors 78 and the NMOS transistor 80 whose gate terminals are connected to the output node N4 are coupled in series between the external power supply voltage VCC and the ground voltage VSS the gate terminal of the PMOS transistor 66 is connected to the output node N4 and that of the PMOS transistor 70 is connected to the control node N3. As shown, the cross coupled PMOS transistors 66 and 70 and the NMOS transistors 68 and 74 also form a differential circuit generally called a cascade converter.

As easily understood, operation of the latch enable equalization signal generator shown in FIG. 6 is performed in the same manner as that of the bit line equalization signal generator of FIG. 5.

In FIG. 6, the latch enable equalization signal PLAEQ is maintained at the level of the external power supply voltage of about 3.3V while the equalization operations of the P-type sense amplifier and N-type sense amplifier latch enable signals LA and fheightLA are performed. The NMOS transistors 24, 26, and 28 of the sense amplifier equalization circuit 40 are thus turned on during the equalization operation of the latch enable signals LA and fheightLA. When the bit lines BL and fheightBL arrive at the level of the ½•IVC, i.e, 1V, the gate-source voltages of the NMOS transistors 24, 26, and 28 are more than 2.3V. Therefore, even if the threshold voltages of the NMOS transistors 24, 26, and 28 are given as Vtn≧1V in consideration of the body effect, it is possible to smoothly perform the equalization of the latch enable signals LA and fheightLA.

Further, in the latch enable equalization signal generator shown in FIG. 6, even if the boost voltage VPP is used as the operating voltage instead of the external power supply voltage VCC, the same efficient operation is provided as described above.

As mentioned above, one skilled in the art will recognize that the invention concepts of the present invention can be applied to sense amplifier circuits other than the on described above. Accordingly, various modifications may be without departing from the spirit or scope of the general inventive concept as defined by the appended claims and their equivalents.

What is claimed is:

1. A sensing circuit for a semiconductor memory device having a plurality of memory cells which each store data, said sensing circuit comprising:

a bit line for transferring said data from one of said memory cells;

a bit line equalization circuit for precharging said bit line prior to transferring said data from said memory cell to said bit line, said bit line equalization circuit being activated by a bit line equalization signal having a first voltage level that is substantially equal to or greater than an external power supply voltage;

a sense amplifier which amplifies said data that has been transferred to said bit line;

a sense amplifier equalization circuit which precharges said sense amplifier prior to said transfer of said data to said bit line, said sense amplifier equalization circuit being activated by a sense amplifier equalization signal which has a second voltage level that is substantially equal to or greater than said external power supply voltage;

a bit line equalization signal generator for generating said bit line equalization signal; and a sense amplifier equalization signal generator for generating said sense amplifier equalization signal.

2. A sensing circuit according to claim 1 wherein said external power supply voltage is less than 2.5 volts.

3. A sensing circuit according to claim 1, wherein each of said bit line equalization signal generator and said sense amplifier equalization generator comprises:

a first NMOS transistor which discharges a control node when activated by a control signal;

an inverter which inverts said control signal to obtain an inverted control signal;

a second NMOS transistor which discharges an output node when activated by said inverted control signal;

a first PMOS transistor which charges said output node to one of an external power supply voltage level and a boost voltage level that is greater than said external power supply voltage, said first PMOS transistor being controlled by said control node;

a second PMOS transistor which charges said control node to one of said external power supply voltage level and a boost voltage level that is greater than said external power supply voltage, said second PMOS transistor being controlled by said output node; and a third PMOS transistor and a fourth NMOS transistor being series connected between said external power supply voltage and a ground voltage, said third PMOS transistor and said fourth NMOS transistor having gate terminals connected to said output node.

4. A sensing circuit according to claim 3, wherein said inverter has an operating voltage at an internal power supply voltage level.

5. A sensing circuit according to claim 3 wherein said external power supply voltage is less than 2.5 volts.

6. A sensing circuit according to claim 1, wherein said bit line equalization signal generator comprises:

a first NMOS transistor which discharges a control node when activated by a control signal;

an inverter which inverts said control signal to obtain an inverted control signal;

a second NMOS transistor which discharges an output node when activated by said inverted control signal;

a first PMOS transistor which charges said output node to one of an external power supply voltage level and a boost voltage level that is greater than said external power supply voltage, said first PMOS transistor being controlled by said control node;

a second PMOS transistor which charges said control node to one of said external power supply voltage level and a boost voltage level that is greater than said external power supply voltage, said second PMOS transistor being controlled by said output node; and a third PMOS transistor and a fourth NMOS transistor being series connected between said external power supply voltage and a ground voltage, said third PMOS transistor and said fourth NMOS transistor having gate terminals connected to said output node.

7. A sensing circuit according to claim 6, wherein an operating voltage of said inverter is at a level of an internal power supply voltage.

8. A sensing circuit according to claim 7 wherein said external power supply voltage is less than 2.5 volts.

9. A sensing circuit according to claim 1, wherein said sense amplifier equalization generator comprises:

a first NMOS transistor which discharges a control node when activated by a control signal;

an inverter which inverts said control signal to obtain an inverted control signal;

a second NMOS transistor which discharges an output node when activated by said inverted control signal;

a first PMOS transistor which charges said output node to one of an external power supply voltage level and a boost voltage level that is greater than said external power supply voltage, said first PMOS transistor being controlled by said control node;

a second PMOS transistor which charges said control node to one of said external power supply voltage level and a boost voltage level that is greater than said external power supply voltage, said second PMOS transistor being controlled by said output node; and a third PMOS transistor and a fourth NMOS transistor being series connected between said external power supply voltage and a ground voltage, said third PMOS transistor and said fourth NMOS transistor having gate terminals connected to said output node.

10. A sensing circuit according to claim 9, wherein an operating voltage of said inverter is at a level of an internal power supply voltage.

11. A sensing circuit according to claim 10 wherein said external power supply voltage is less than 2.5 volts.

12. A sensing circuit for a semiconductor memory device having a plurality of memory cells which each store data, said sensing circuit comprising:

a bit line for transferring said data from one of said memory cells;

a bit line equalization circuit for precharging said bit line prior to transferring said data from said memory cell to said bit line, said bit line equalization circuit including an equalization transistor having a predetermined threshold voltage;

a sense amplifier which amplifies said data that has been transferred to said bit line; and a sense amplifier equalization circuit which precharges said sense amplifier prior to said transfer of said data to said bit line, said sense amplifier equalization circuit being activated by a sense amplifier equalization signal which has a voltage level greater than said threshold voltage of said equalization transistor.

13. A sensing circuit according to claim 12 wherein said bit line includes a complementary bit line and a non-complementary bit line; and said equalization transistor is connected between said complementary bit line and said non-complementary bit line.

14. A sensing circuit according to claim 12 wherein said bit line equalization circuit is activated by a bit line equalization signal having a first voltage level that is equal to or greater than an external power supply voltage; and said sense amplifier equalization circuit is activated by a sense amplifier equalization signal which has a second voltage level that is equal to or greater than said external power supply voltage.

15. A sensing circuit according to claim 14 wherein said bit line includes a complementary bit line and a non-complementary bit line; and said equalization transistor is connected between said complementary bit line and said non-complementary bit line.

16. A sensing circuit according to claim 14 wherein said external power supply voltage is less than 2.5 volts.

17. A sensing circuit according to claim 16 wherein said bit line includes a complementary bit line and a non-complementary bit line; and said equalization transistor is connected between said complementary bit line and said non-complementary bit line.

18. A signal generating circuit for one of a bit line equalization signal generator and a sense amplifier equalization generator comprising:

a first NMOS transistor which discharges a control node when activated by a control signal;

an inverter which inverts said control signal to obtain an inverted control signal;

a second NMOS transistor which discharges an output node when activated by said inverted control signal;

a first PMOS transistor which charges said output node to one of an external power supply voltage level and a boost voltage level that is greater than said external power supply voltage, said first PMOS transistor being controlled by said control node;

a second PMOS transistor which charges said control node to one of said external power supply voltage level and a boost voltage level that is greater than said external power supply voltage, said second PMOS transistor being controlled by said output node; and a third PMOS transistor and a fourth NMOS transistor being series connected between said external power supply voltage and a ground voltage, said third PMOS transistor and said fourth NMOS transistor having gate terminals connected to said output node.

19. A signal generating circuit according to claim 18 further including a boosting circuit for supplying said boost voltage level.

20. A signal generating circuit according to claim 18, wherein said inverter has an operating voltage at an internal power supply voltage level.

21. A signal generating circuit according to claim 18 wherein said external power supply voltage is less than 2.5 volts.

* * * * *